(12) United States Patent
Jang et al.

(10) Patent No.: US 10,911,041 B2
(45) Date of Patent: Feb. 2, 2021

(54) ELECTRONIC CIRCUIT MODULE AND VEHICLE INCLUDING THE SAME

(71) Applicants: Hyundai Motor Company, Seoul (KR); Kia Motors Corporation, Seoul (KR); Postech Academy-Industry Foundation, Gyeongsangbuk-do (KR)

(72) Inventors: Jiwoong Jang, Gyeonggi-do (KR); Ki Jong Lee, Gyeonggi-do (KR); Sangcheol Shin, Gyeonggi-do (KR); Ki Young Jang, Incheon (KR); Kangho Jeong, Gyeongsangnam-Do (KR); Kwang Hee Nam, Gyeongsangbuk-do (KR); Sung Jin Kim, Gyeonggi-do (KR)

(73) Assignees: Hyundai Motor Company, Seoul (KR); Kia Motors Corporation, Seoul (KR); Postech Academy-Industry Foundation, Gyeongsangbuk-do (KR)

( * ) Notice: Subject to any disclaimer, the term of this patent is extended or adjusted under 35 U.S.C. 154(b) by 380 days.

(21) Appl. No.: 15/834,576

(22) Filed: Dec. 7, 2017

(65) Prior Publication Data
US 2019/0103865 A1    Apr. 4, 2019

(30) Foreign Application Priority Data
Sep. 29, 2017   (KR) .......................... 10-2017-0126815

(51) Int. Cl.
*H03K 17/0812* (2006.01)
*B60R 16/03* (2006.01)
(Continued)

(52) U.S. Cl.
CPC ....... *H03K 17/08122* (2013.01); *B60R 16/03* (2013.01); *G01C 21/26* (2013.01);
(Continued)

(58) Field of Classification Search
CPC ......... H03K 17/08122; H03K 17/0822; H03K 2217/0027; G01C 21/26; B60R 16/03;
(Continued)

(56) References Cited

U.S. PATENT DOCUMENTS

| | | | | |
|---|---|---|---|---|
| 5,491,445 A * | 2/1996 | Moller | ...................... | G05F 1/46 323/222 |
| 6,027,029 A * | 2/2000 | Kim | ...................... | G06K 19/07 235/492 |
| 6,828,766 B2 * | 12/2004 | Corva | ................... | H02M 3/156 323/284 |
| 2005/0127881 A1 * | 6/2005 | Sase | ...................... | H02M 3/156 323/225 |

(Continued)

*Primary Examiner* — Jared Fureman
*Assistant Examiner* — Michael J Warmflash
(74) *Attorney, Agent, or Firm* — Mintz Levin Cohn Ferris Glovsky and Popeo, P.C.; Peter F. Corless

(57) ABSTRACT

An electronic circuit module is provided. The electronic circuit module prevents damage by efficiently detecting an overcurrent in the electronic circuit module using an SiC MOSFET. The electronic circuit module includes an input unit that is configured to input a reference voltage and a switching unit that is configured to output a first voltage based on a current flow. A converter is configured to output a second voltage based on the first voltage and the reference voltage. An output unit is configured to compare a magnitude of the reference voltage with a magnitude of the second voltage to output a feedback signal when the second voltage is greater than the reference voltage.

16 Claims, 11 Drawing Sheets

(51) Int. Cl.
  *H02M 1/08* (2006.01)
  *G01C 21/26* (2006.01)
  *H03K 17/082* (2006.01)
  *H02M 1/00* (2006.01)

(52) U.S. Cl.
  CPC .......... *H02M 1/08* (2013.01); *H03K 17/0822* (2013.01); *H02M 2001/0054* (2013.01); *H03K 2217/0027* (2013.01)

(58) Field of Classification Search
  CPC ............ H02M 1/08; H02M 2001/0054; G01R 19/16519; G01R 19/16523
  See application file for complete search history.

(56) References Cited

U.S. PATENT DOCUMENTS

| | | | |
|---|---|---|---|
| 2008/0080115 A1* | 4/2008 | Martins | H02H 3/093 361/94 |
| 2008/0231244 A1* | 9/2008 | Yamada | H02M 1/32 323/282 |
| 2009/0212740 A1* | 8/2009 | Felps | H01M 10/425 320/134 |
| 2014/0160805 A1* | 6/2014 | Oh | H02M 1/4241 363/21.02 |
| 2016/0043634 A1* | 2/2016 | Bemat | H02M 7/217 713/300 |
| 2017/0371367 A1* | 12/2017 | Liu | H02M 7/533 |
| 2018/0183228 A1* | 6/2018 | Huber | G01R 19/165 |
| 2018/0281600 A1* | 10/2018 | Zhou | B60L 53/14 |
| 2018/0366970 A1* | 12/2018 | Zhou | H02J 7/0034 |
| 2019/0103865 A1* | 4/2019 | Jang | G01C 21/26 |
| 2020/0021227 A1* | 1/2020 | Lee | H02P 27/08 |

\* cited by examiner

ELECTRONIC CIRCUIT MODULE AND VEHICLE INCLUDING THE SAME

CROSS-REFERENCE TO RELATED APPLICATION

This application claims the benefit of Korean Patent Application No. 10-2017-0126815, filed on Sep. 29, 2017, the disclosure of which is incorporated herein by reference.

BACKGROUND

1. Field of the Disclosure

The present disclosure relates to an electronic circuit module that detect an overcurrent in an electronic device, and a vehicle including the same, and more particularly, to an electronic circuit module that prevents damage by efficiently detecting an overcurrent in the electronic circuit module using an SiC MOSFET, and a vehicle including the same.

2. Description of the Related Art

Generally, overcurrent detection technology utilizes a phenomenon in which a voltage at both ends of a switching element increases as current increases in an overcurrent situation. When the voltage at both ends of the switching element is increased to exceed a reference threshold voltage, a comparator is used to generate a signal to sense a current exceeding a rated current of the switching element. Accordingly, a fault signal is transmitted to a gate-driver of the circuit to engage a soft turn-off a MOSFET to protect the switch from being destroyed by an overcurrent.

Further, the overcurrent detection technology is used in an insulated gate bipolar mode transistor (IGBT), which is used as a conventional large power semiconductor switch. However, as SiC MOSFETs which are wide-band-gap (WBG) elements have been developed research has been conducted to incorporate the overcurrent detection technology into the SiC MOSFETs.

It should be understood that the foregoing description of the background art is merely for the purpose of promoting an understanding of the background of the present disclosure and is not to be construed as an admission that the prior art is known to those skilled in the art.

SUMMARY

The present disclosure provides an electronic circuit module that may prevent damage by efficiently detecting an overcurrent flow in the electronic circuit module using a SiC MOSFET, and a vehicle including the same. In an aspect of an exemplary embodiment of the present disclosure, an electronic circuit module may include an input unit configured to input a reference voltage, a switching unit configured to output a first voltage based on a current flow, a converter configured to output a second voltage based on the first voltage and the reference voltage, and an output unit configured to compare a magnitude of the reference voltage with a magnitude of the second voltage to output a feedback signal when the second voltage is greater than the reference voltage.

In some exemplary embodiments, the convertor may be configured to output the second voltage having a ratio of a variation of the second voltage to a variation of the current that is greater than a ratio of a variation of the first voltage to the variation of the current when the current is greater than a predetermined value. The convertor may include a comparator configured to compare a magnitude of a first division voltage obtained by dividing the first voltage by a predetermined ratio with a magnitude of a division reference voltage obtained by dividing the reference voltage by a predetermined ratio to output a third voltage, and an adder configured to output the second voltage based on the third voltage and the first division voltage. The comparator may include a resistor and may be configured to adjust a magnitude of the third voltage by using the resistor.

Additionally, the electronic circuit module may further include a controller configured to receive the first voltage from the switching unit to adjust a time period required for the second voltage to reach the reference voltage. The input unit may be configured to input a source current to the controller, and the controller may include a capacitive element and may be configured to receive the source current to adjust the time period required for the second voltage to reach the reference voltage based on the source current and capacitance of the capacitive element.

In other exemplary embodiments, the switching unit may include a MOSFET configured to operate based on a magnitude of the current flow, and a diode connected to the MOSFET. The switching unit may be configured to output the first voltage by combining a voltage at a first end and a second end of the MOSFET with a voltage at a first end and a second end of the diode. The convertor may include a capacitive element configured to reduce noise of the second voltage.

In an aspect of an exemplary embodiment of the present disclosure, a vehicle may include an input unit configured to input a reference voltage, a switching unit configured to output a first voltage based on a current flow, a converter configured to output a second voltage based on the first voltage and the reference voltage, and an output unit configured to compare a magnitude of the reference voltage with a magnitude of the second voltage to output a feedback signal when the second voltage is greater than the reference voltage.

The convertor may be configured to output the second voltage having a ratio of a variation of the second voltage to a variation of the current that is greater than a ratio of a variation of the first voltage to the variation of the current when the current is greater than a predetermined value. The convertor may include a comparator configured to compare a magnitude of a first division voltage obtained by dividing the first voltage by a predetermined ratio with a magnitude of a division reference voltage obtained by dividing the reference voltage by a predetermined ratio to output a third voltage. An adder may be configured to output the second voltage based on the third voltage and the first division voltage. The comparator may include a resistor and may be configured to adjust a magnitude of the third voltage using the resistor.

In another aspect of an exemplary embodiment of the present disclosure, the vehicle may further include a controller configured to receive the first voltage from the switching unit to adjust a time required for the second voltage to reach the reference voltage. The input unit may input a source current to the controller. The controller may include a capacitive element and may be configured to receive the source current to adjust the time period required for the second voltage to reach the reference voltage based on the source current and capacitance of the capacitive element.

The switching unit may include a MOSFET configured to operate based on a magnitude of the current flow, and a diode connected to the MOSFET. The switching unit may be configured to output the first voltage by combining a voltage at a first end and a second of the MOSFET with a voltage at a first end and a second end of the diode. The convertor may include a capacitive element configured to reduce noise of the second voltage.

In accordance with another aspect of the present disclosure, an electronic circuit system may include an input unit configured to input a reference voltage, a switching unit configured to output a first voltage based on a flowing current, a converter configured to output a second voltage based on the first voltage and the reference voltage, and an output unit configured to compare a magnitude of the reference voltage with a magnitude of the second voltage to output a feedback signal when the second voltage is greater than the reference voltage.

The convertor may be configured to output the second voltage having a ratio of a variation of the second voltage to a variation of the current that is greater than a ratio of a variation of the first voltage to the variation of the current when the current is greater than a predetermined value. The convertor may include a comparator configured to compare a magnitude of a first division voltage obtained by dividing the first voltage by a predetermined ratio with a magnitude of a division reference voltage obtained by dividing the reference voltage by a predetermined ratio to output a third voltage. An adder may be configured to output the second voltage based on the third voltage and the first division voltage.

BRIEF DESCRIPTION OF THE DRAWINGS

These and other aspects of the disclosure will become apparent and more readily appreciated from the following description of the exemplary embodiments, taken in conjunction with the accompanying drawings of which.

DETAILED DESCRIPTION

Figure 1:
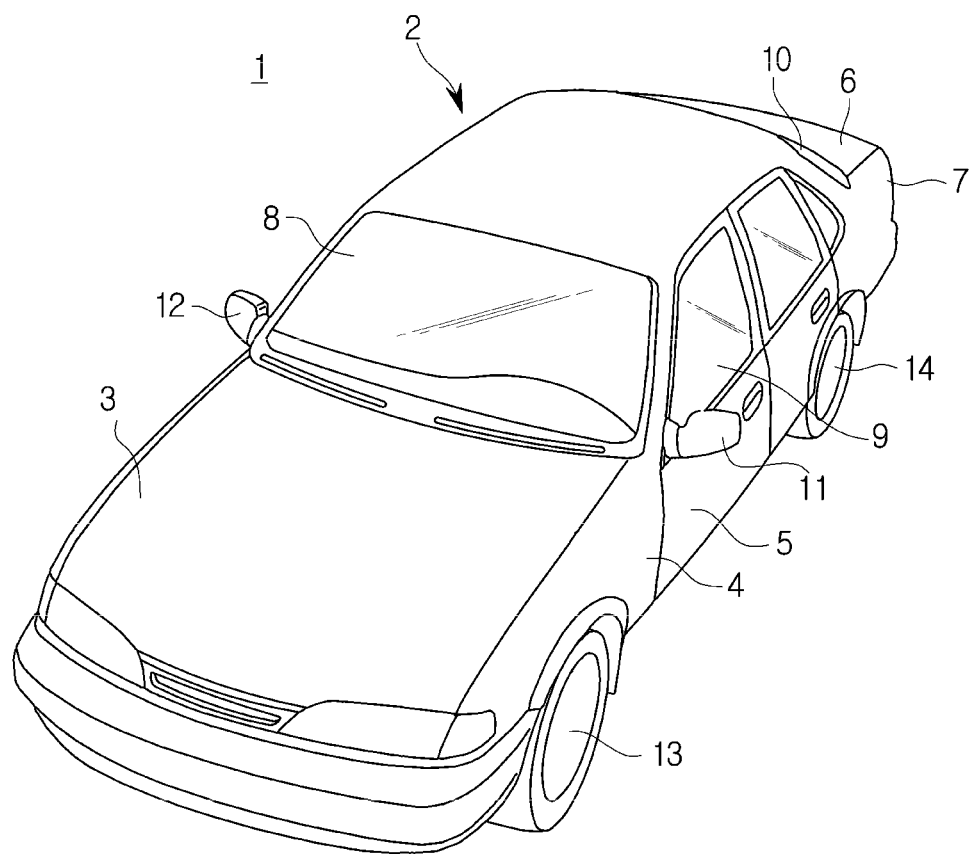
FIG. 1 is an exemplary view illustrating an exterior of a vehicle in accordance with an exemplary embodiment of the present disclosure.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, in order to make the description of the present disclosure clear, unrelated parts are not shown and, the thicknesses of layers and regions are exaggerated for clarity. Further, when it is stated that a layer is "on" another layer or substrate, the layer may be directly on another layer or substrate or a third layer may be disposed therebetween.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Like reference numerals refer to like elements throughout the specification. The specification does not describe all the elements of the exemplary embodiments, and general content of a related art or redundant content in the embodiments will be omitted. The terms "unit," "module," "member," and "'block" used herein may be implemented by hardware or software. It is also possible for a plurality of units, modules, members, and blocks to be implemented as one element, or for one unit, module, member, or block to include a plurality of elements in accordance with the exemplary embodiments.

Throughout the specification, when an element is referred to as being "connected" to another element, the element may be directly connected or indirectly connected to another element. An indirect connection includes a connection through a wireless communication network. Terms such as "first" or "second" may be used to distinguish one element from another element, but the elements are not limited by the terms. Hereinafter, the working principle and exemplary embodiments of the present disclosure will be described with reference to the accompanying drawings.

FIG. 1 is an exemplary view illustrating an exterior of a vehicle in accordance with an exemplary embodiment of the present disclosure. Referring to FIG. 1, a vehicle 1 may include a vehicle body 2 that forms an exterior of the vehicle 1, and wheels 13 and 14 configured to move the vehicle 1. The vehicle body 2 may include a hood 3, front fenders 4, doors 5, a trunk lid 6, quarter panels 7, and the like. In addition, a front window 8 disposed at a front side of the vehicle body 2 to provide a field of vision in a forward direction of the vehicle 1, side windows 9 disposed to provide a field of vision in a lateral direction of the vehicle 1, side mirrors 11 and 12 disposed on the doors 5 to provide a field of vision in rearward and lateral directions of the vehicle 1, and a rear window 10 disposed on a rear side of the vehicle body 2 to provide a field of vision in the rearward direction of the vehicle 1 may be disposed external to the vehicle body 2.

The wheels 13 and 14 may include a front wheel 13 disposed at the front side of the vehicle and a rear wheel 14 disposed at the rear side of the vehicle, and a driving device (not shown) configured to provide a rotational force to the front wheel 13 or the rear wheel 14 to enable the vehicle body 2 to move in a forward or rearward direction. The driving device may include an engine configured to generate the rotational force by burning a fossil fuel, or a motor configured to generate the rotational force by receiving power from an electric condenser.

Figure 2:
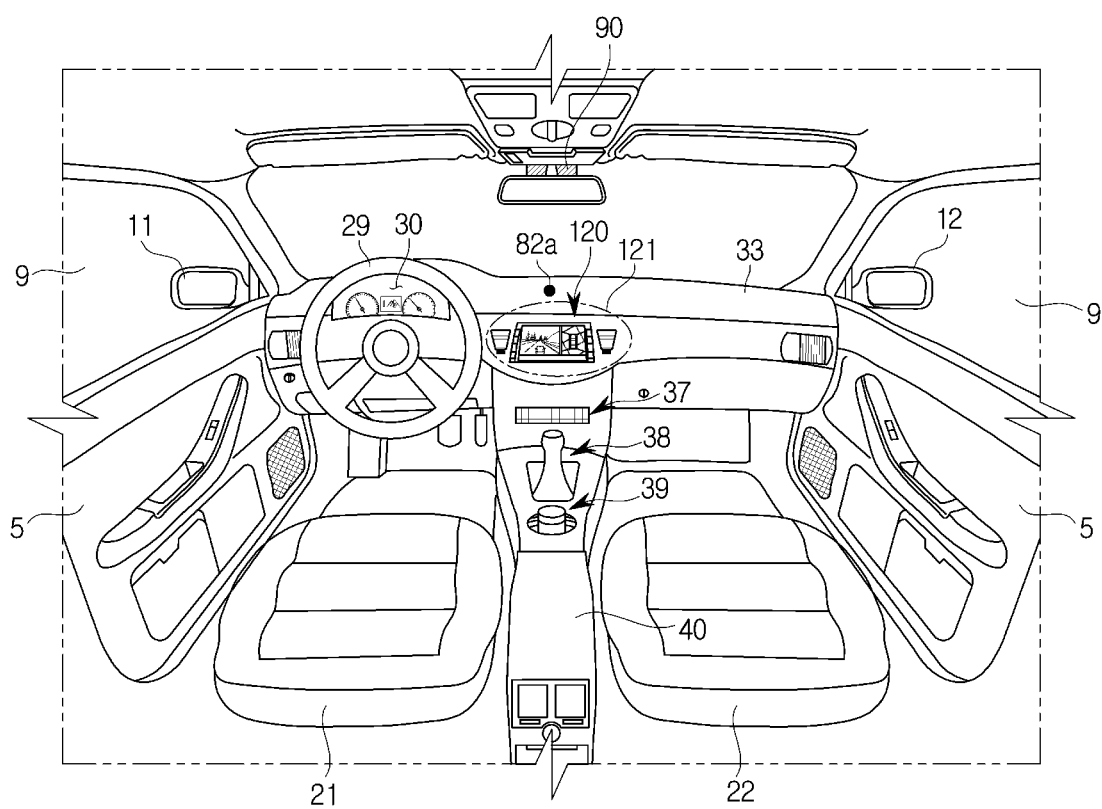
FIG. 2 is an exemplary view illustrating a front portion within the vehicle in accordance with an exemplary embodiment of the present disclosure.

FIG. 2 is an exemplary view illustrating a front portion within the vehicle front in accordance with an exemplary embodiment of the present disclosure. Referring to FIG. 2, an interior of the vehicle 1 may include a seat, a dashboard 33, an instrument panel (i.e., a cluster 30) disposed on the dashboard and provided with a tachometer, a speedometer, a coolant thermometer, a fuel gauge, a turn signal indicator light, a high beam indicator light, a warning light, a seatbelt warning light, a trip odometer, an odometer, an automatic transmission selection lever indicator light, a door open warning light, an engine oil warning light, and a low fuel warning light, a steering wheel 31 configured to manipulate a direction of the vehicle, and a center fascia 35 that may include a blowing port and a control panel of an air conditioner and an audio device.

Further, the center console 37 may include a jog shuttle type or hard key type center input unit 39. The center console 37 may include a portion disposed between a driver seat 21 and a passenger seat 22 and having a gear control lever 38 and a tray 40 formed therein. The seat 20 may include the driver seat 21, the passenger seat 22, and a rear seat disposed at a rear side of the interior of the vehicle. The cluster 30 may be implemented in a digital manner. In other words, the digital cluster 30 may be configured to display vehicle information and traveling information as images. The center fascia 35 may be a portion disposed between the driver seat 21 and the passenger seat 22 in the dashboard 33 and may include a blowing port and a cigar jack.

An audio video navigation (AVN) device 121 may be disposed in the interior of the vehicle 1. The AVN device 121 may be a terminal that integrally provides audio and video functions as well as a navigation function for providing a route to a destination to a user. The AVN device 121 may be configured selectively display at least one of an audio screen, a video screen, and a navigation screen through the display 120, but may also be configured to display a screen related to an additional function related to control of the vehicle 1. The display 120 may be disposed in the center fascia 35, which is a central region of the dashboard 33. In accordance with an exemplary embodiment, the display 120 may be implemented as a liquid crystal display (LCD), a light emitting diode (LED), a plasma display panel (PDP), an organic light emitting diode (OLED), a cathode ray tube (CRT), and the like, but is not limited thereto. The center console 37 may include the jog shuttle type or hard key type center input unit 39. The center input unit 39 may be configured to perform all or some of the functions of the AVN device 121.

An electronic circuit module 100, which will be described below, may include components illustrated in FIGS. 1 and 2, which receive a current. In particular, the electronic circuit module 100 described below may be included in a configuration of an inverter configured to receive a current among components using electricity in the vehicle.

Figure 3A:
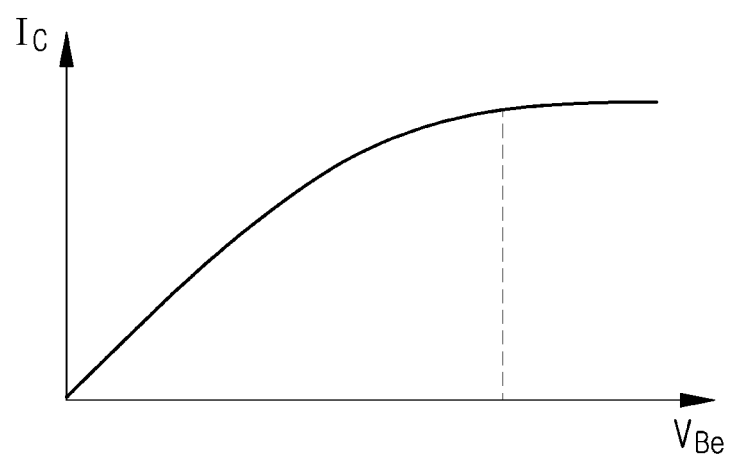
FIGS. 3A and 3B are exemplary graphs illustrating a relation between a voltage and a current in accordance with an exemplary embodiment of the present disclosure.
Figure 3B:
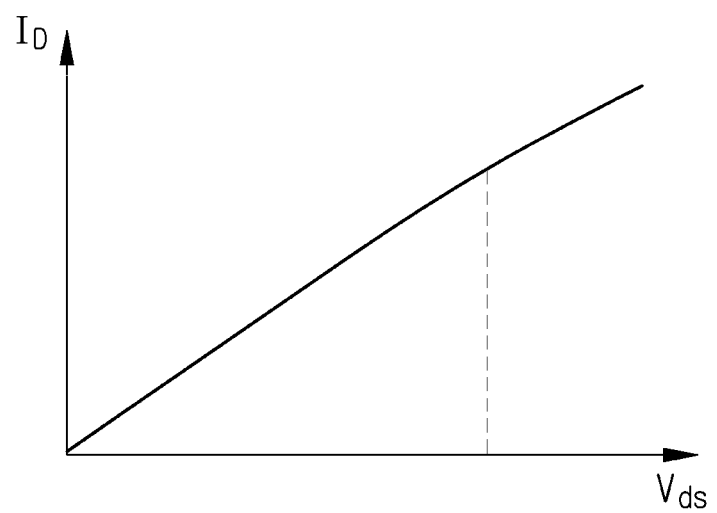

FIGS. 3A and 3B are exemplary graphs illustrating a relation between a voltage and a current in accordance with an exemplary embodiment. In FIG. 3A, an X-axis may represent a voltage between a first end and a second end (e.g., both ends) of an Si insulated gate bipolar mode transistor (IGBT), and a Y-axis represents a collector current. In FIG. 3B, an X-axis may represent a voltage between a first end and second end (e.g., both ends) of an SiC MOSFET, and a Y-axis represents a drain current. FIG. 3A illustrates the collector current of the Si IGBT and the voltage between a first end and a second end (e.g., both ends) of the Si IGBT. FIG. 3B illustrates the drain current of the SiC MOSFET and the voltage between the first end and the second end (e.g., both ends) of the SiC MOSFET.

In the Si IGBT, apertures, which are minority carriers may be injected into a drift layer to form a resistance thereof less than a resistance of the SiC MOSFET. However, this leads to generation of a current during an OFF state caused by minority carrier accumulation, resulting in greater switching losses. When an SiC shows a lower drift layer resistance than Si devices, it is unnecessary to perform conductivity modulation. Accordingly, a high withstand voltage and a low resistance may be simultaneously implemented in high-speed devices including SiC MOSFETs. Therefore, since current is not generated by the SiC MOSFET, replacing Si IGBTs with SiC MOSFETs may significantly reduce the switching loss and may reduce a size of a cooler.

Additionally the SiC MOSFET miniaturization of passive components may be achieved through high-frequency operation that may not be achieved with the Si IGBT. The SiC MOSFET may provide advantages including a reduced chip area even at about 600 V to 900 V (e.g., enabling mounting in smaller packages), a remarkably lower recovery loss of a diode, etc.

As shown in FIG. 3A, the Si IGBT may have a substanital voltage change when a current greater than or equal to a predetermined value flows thereto. As shown in FIG. 3B, the current and voltage of the SiC MOSFET change linearly, and thus a voltage change based on the current change may be less than that of the Si IGBT. Therefore, the current change due to an increased voltage change based on the current change in the electronic circuit module 100 configured to detect an overcurrent based on the voltage output from the SiC MOSFET may be more easily obtained. The electronic circuit module 100 that improve the above features of the SiC MOSFET will be described in the present disclosure.

Figure 4:
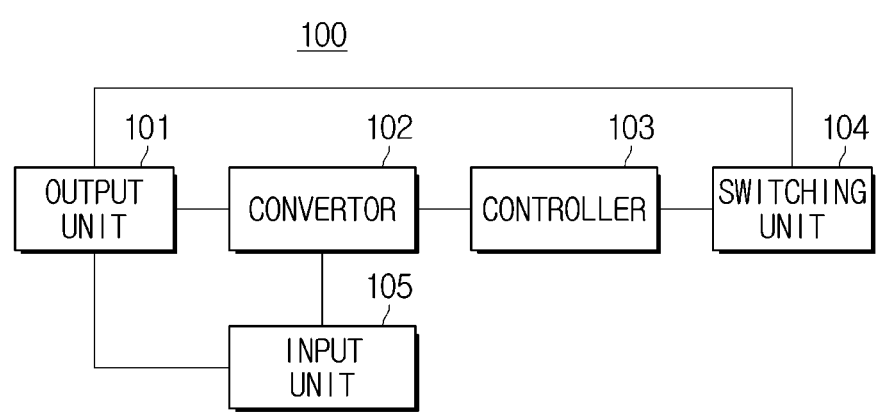
FIG. 4 is an exemplary control block diagram in accordance with an exemplary embodiment of the present disclosure.

FIG. 4 is an exemplary control block diagram in accordance with an exemplary embodiment of the present disclosure. Referring to FIG. 4, the electronic circuit module 100 in accordance with an exemplary embodiment may include an output unit 101, a convertor 102, a controller 103, a switching unit 104, and an input unit 105.

In particular, the switching unit 104 may be configured to output a first voltage V1 based on a current flowing therein. The switching unit 104 may be configured to output the first voltage V1 based on a current supplied to an electronic device, and specifically, may output the first voltage V1 based on a magnitude of the current. The switching unit 104 may include a MOSFET. In the MOSFET that may be included in the switching unit 104, a voltage at a first end and a second end (e.g., both ends) of the MOSFET may increase as a drain current increases. In addition, the switching unit 104 may include a one diode connected to the MOSFET. The switching unit 104 may be configured to output the first voltage V1 obtained by combining the voltage increased based on the current flowing in the switching unit 104 with a breakdown voltage of the diode.

Conventionally, a Si IGBT is used in the switching unit 104. However, the MOSFET used in the exemplary embodiment, that is, the SiC MOSFET, may have an improved thermal conductivity and may have a conductivity loss and a switching loss less than that of the conventional Si IGBT. Additionally, the SiC MOSFET may be configured to receive a higher voltage than the Si IGBT. However, unlike the Si IGBT, the SiC MOSFET does not include a threshold voltage, and the voltage at the first end and the second end of the SiC MOSFET may linearly increase when the drain current increases. A detailed description thereof will be given below. In addition, the switching unit 104 may include a diode. The diode included in the switching unit 104 may be provided as a type of diode that may include a Schottky diode and a TVS Zener diode. The diode included in the switching unit 104 may prevent a false triggering thereof due to a reverse recovery spike of the switching unit 104 that occurs in a transition period when the switching unit 104 is turned on or off.

The controller 103 may be configured to receive the first voltage V1 from the switching unit 104 to adjust a time period required for a second voltage V2 used by the output unit 101 to reach a reference voltage, which will be described below. The controller 103 may be configured to receive a source current from the input unit 105 and adjust the time required for the second voltage V2 to reach the reference voltage using the source current and a capacitive element included in the controller 103. A detailed description thereof will be given below.

The convertor 102 may be configured output the second voltage V2 based on the first voltage V1 and the reference voltage. In particular, when the current of the switching unit 104 is greater than a predetermined value, the convertor 102 may be configured to output the second voltage V2 having a ratio of a variation of the second voltage V2 to a variation of the current is greater than a ratio of a variation of the first voltage V1 to the variation of the current. When the current that flows in the switching unit 104 increases the switching unit 104 may be configured to output the first voltage V1. Further, as in a description which will be described below, since the output unit 101 may use the second voltage V2 to detect an overcurrent, the overcurrent may be detected more easily when the variation of the second voltage V2 is greater than the variation of the first voltage V1 to exceed the change of the current. Therefore, the convertor 102 may be configured to output the second voltage V2 which is significantly adjusted in response to the change of the current. This operation may allow the electronic circuit module 100 to more easily detect the overcurrent.

Further, the convertor 102 may include a comparator 102-1 and an adder 102-2. The comparator 102-1 may be configured to compare a magnitude of a first division voltage obtained by dividing the first voltage V1 by a predetermined ratio with a magnitude of a division reference voltage obtained by dividing the reference voltage by a predetermined ratio to output a third voltage V3. The third voltage V3 may be adjusted by a resistor connected to the comparator 102-1. A detailed description thereof will be given below. The adder 102-2 may be configured to output the second voltage V2 by combining the third voltage V3 with the first division voltage. In addition, the convertor 102 may include a capacitive element configured to reduce noise of the second voltage V2, and the capacitive element may be configured to perform a function of a bypass filter. In accordance with an exemplary embodiment, the comparator 102-1 and the adder 102-2 may be implemented in the form of an operational amplifier (Op-amp).

The output unit 101 may be configured to compare a magnitude of the reference voltage with a magnitude of the second voltage V2 to output a feedback signal when the second voltage V2 is greater than the reference voltage. The second voltage V2 greater than the reference voltage means that an overcurrent is flowing, and thus the output unit 101 may be configured to output the feedback signal corresponding to the overcurrent flow. The feedback signal output by the output unit 101 may be used to turn off the switching unit 104. The output unit 101 may be implemented in the form of an Op-amp. At least one component may be added or removed based on performance of components of the electronic circuit module 100 illustrated in FIG. 4. In addition, it should be readily understood by those skilled in the art that positions of the components may be changed on the basis of performance or a structure of a system.

Figure 5:
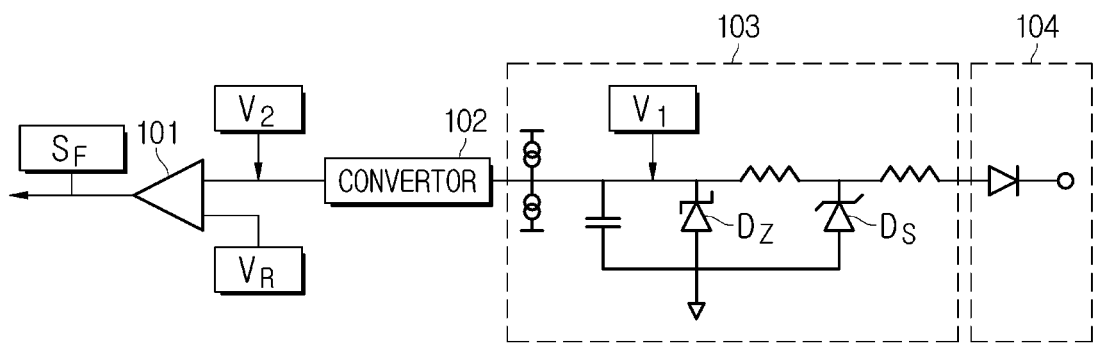
FIG. 5 is an exemplary circuit diagram of an electronic circuit module in accordance with an exemplary embodiment of the present disclosure.

FIG. 5 is an exemplary circuit diagram of the electronic circuit module 100 in accordance with an exemplary embodiment. Referring to FIG. 5, FIG. 5 is an exemplary detailed circuit diagram of the control block diagram of FIG. 4. The switching unit 104 may include a MOSFET, and a voltage may be applied to a first end and a second end (e.g., both ends) of the MOSFET based on a current flowing therein. In addition, the switching unit 104 may include a diode and may be configured to output a value of a voltage obtained by combining the voltage of the MOSFET with a voltage applied to the diode as the first voltage V1. The switching unit 104 may include a Schottky diode and a TVS Zener diode.

The current flowing in the Schottky diode may be represented by an exponential function of the voltage applied thereto, and may exhibit characteristics similar to that of a semiconductor p-n junction diode. In addition, the Schottky diode may be suitable for high-speed operation due to a current control action performed within a very narrow Schottky barrier, and may be used in a microwave reception mixer, a high-speed logic diode, and the like.

The TVS Zener diode may be an element configured to exhibit the same characteristics as an ordinary diode in a forward direction and may allow a reverse current to flow at a specific voltage (e.g., a breakdown voltage or Zener voltage) less than that of the ordinary diode when a voltage is applied thereto in a reverse direction. Ordinary diodes are used for rectification, detection, and the like because the ordinary diodes rarely allow a current to flow when a voltage is applied thereto in the reverse direction. However, when many impurities are implanted into a PN junction diode, when a voltage is greater than a certain voltage, which is called the Zener voltage or breakdown voltage, a breakdown phenomenon may occur and a reverse current may flow rapidly.

The controller 103 may include a capacitive element and may receive a source current. When the switching unit 104 includes the MOSFET, the first voltage V1 output from the switching unit 104 may output a voltage in a transition state of the MOSFET. The voltage in the transition state among first voltages V1 output from the switching unit 104 may be greater than the reference voltage. However, when the voltage in the transition state of the switching unit 104 is unsuitable for sensing a current state, an overcurrent may not be detected in this period. Therefore, the controller 103 may be configured to provide a blank time to use a value of the first voltage V1 after this time. The blank time may be obtained through the following equation.

$$t = \frac{C \times V1}{is} \qquad \text{Equation 1}$$

wherein, t denotes a blank time, is denotes a source current supplied to the controller 103, and V1 denotes the first voltage V1 output from the switching unit 104. In addition, C denotes capacitance of the capacitive element included in the controller. The blank time may be set to be greater than the time of the transition period of the switching unit 104, which is set to prevent a malfunction, that is, to prevent the electronic circuit module 100 from operating in the transition period of a MOSFET switch.

The first voltage V1 obtained through the switching unit 104 and the controller 103 may be input to the convertor 102, and the convertor 102 may be configure to output the second voltage V2. An operation of outputting the second voltage V2 by the convertor 102 will be described in detail below. When the convertor 102 outputs the second voltage V2, the output unit 101 may be configured to compare the second voltage V2 with the reference voltage, determine that the overcurrent is flowing when the second voltage V2 is greater than the reference voltage, and output a feedback signal. The feedback signal output from the output unit 101 may be re-input to the switching unit 104 to be used to turn off the switching unit 104. Although FIG. 5 illustrates the circuit in accordance with an exemplary embodiment, the form of the circuit used to detect the overcurrent is not limited thereto.

Figure 6:
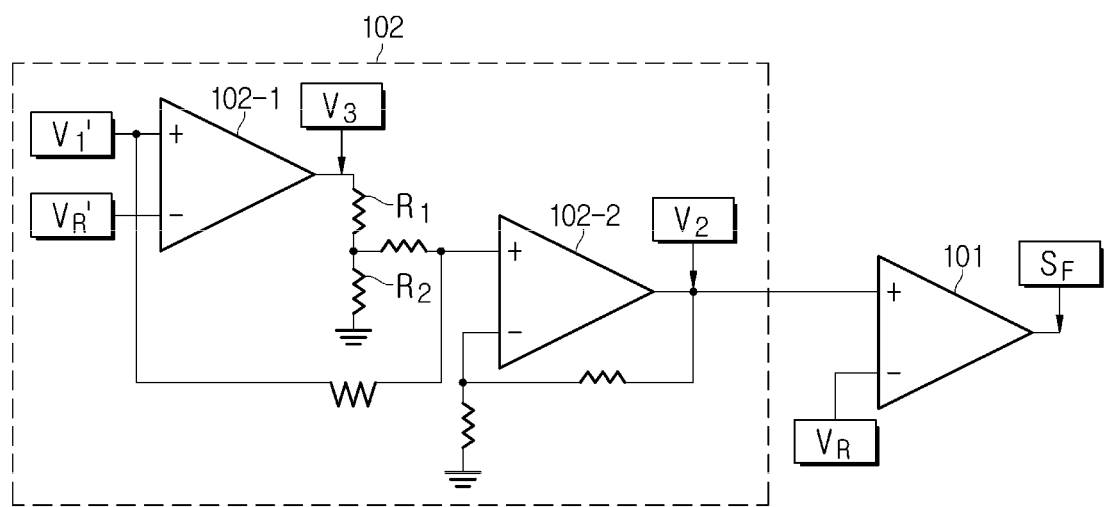
FIG. 6 is an exemplary circuit diagram of a convertor in accordance with an exemplary embodiment of the present disclosure.

FIG. 6 is an exemplary circuit diagram of the convertor 102 in accordance with an exemplary embodiment. Referring to FIG. 6, the convertor 102 may include the comparator 102-1 and the adder 102-2. The comparator 102-1 may be configured to compare the magnitude of the first division voltage obtained by dividing the first voltage V1 by the predetermined ratio with the magnitude of the division reference voltage obtained by dividing the reference voltage by the predetermined ratio to output the third voltage V3. The first voltage V1 may be divided by voltage division after being output from the switching unit 104. The reference voltage may be divided by voltage division after being input to the input unit 105. Although the voltage division may be performed using resistors, the exemplary embodiments for dividing the voltage are not limited thereto.

The comparator 102-1 may be configured to receive the first division voltage and the division reference voltage, which are divided from the first voltage V1 and the reference voltage, respectively, to output the third voltage. A magnitude of the output third voltage V3 may be adjusted when the output third voltage V3 is input to the adder 102-2. The magnitude of the third voltage V3 may be adjusted by a resistor disposed at an output of the comparator 102-1. In particular, when a first resistor R1 and a second resistor R2 are disposed in the convertor 102, the magnitude of the third voltage V3 may be adjusted through the following equation.

$$Vin = \frac{R2}{R1+R2} \times V3 \qquad \text{Equation 2}$$

wherein, Vin denotes a voltage input to the adder 102-2, R1 and R2 denote resistances shown in FIG. 6, and V3 denotes a voltage output from the comparator 102-1. The voltage Vin may be obtained through the above equation and the first division voltage divided in advance may be combined in the adder 102-2. The combined voltage may be output as the second voltage V2. The second voltage V2 denotes a voltage output based on the first voltage V1. When the switching unit 104 includes a MOSFET, a linear variation of the second voltage V2 as a function of a variation of the current may be more significantly fluctuated. A detailed description thereof will be given below. The circuit diagram of FIG. 6 is an exemplary embodiment for implementing the present disclosure, and the form of a circuit configured to increase nonlinearity of the voltage input to the convertor 102 is not limited thereto.

Figure 7:
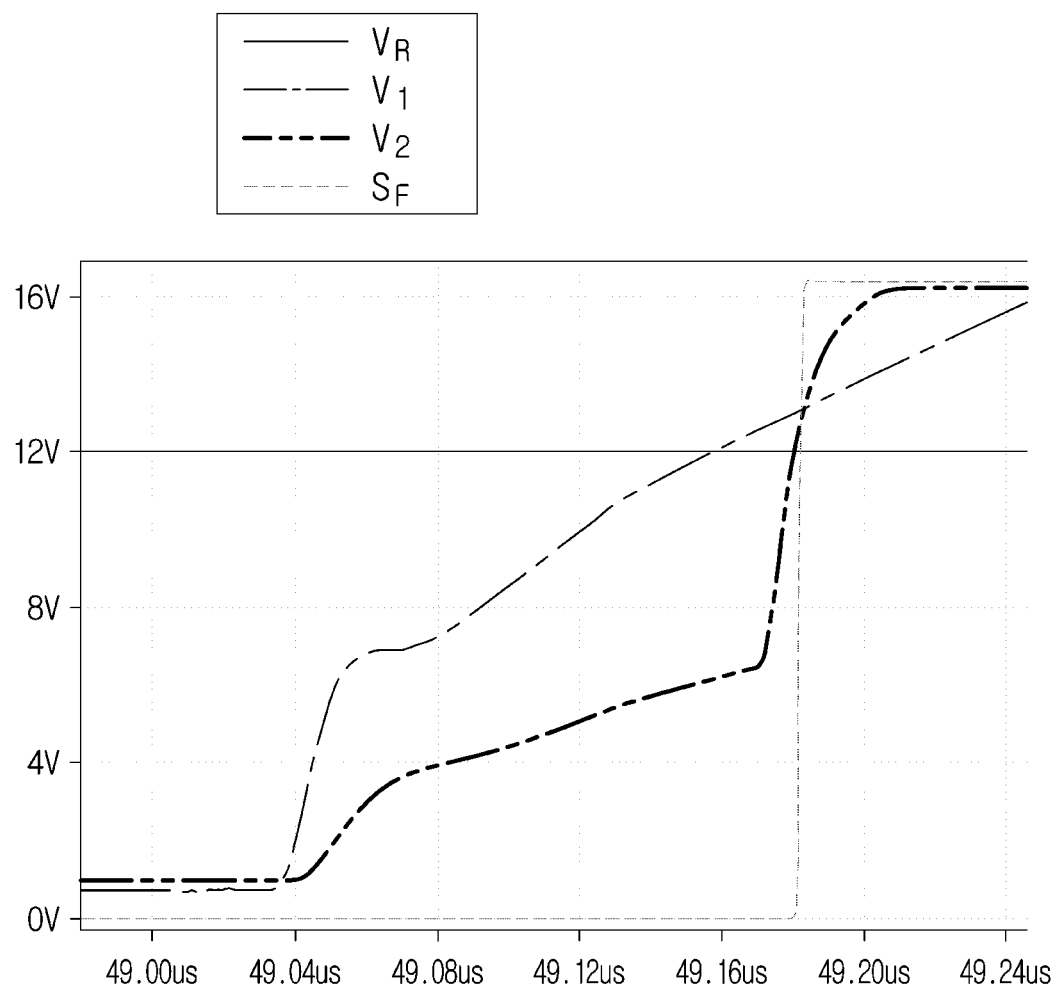
FIG. 7 is a graph of a current flowing in the electronic circuit module and a voltage applied to the electronic circuit module over time in accordance with one embodiment.

FIG. 7 is an exemplary graph of a current flowing in the electronic circuit module 100 and a voltage applied to the electronic circuit module 100 over time in accordance with an exemplary embodiment. Referring to FIG. 7, an X-axis represents time, and a Y-axis represents magnitude of the voltage. In addition, Vr denotes a reference voltage for determining an overcurrent, V1 denotes the first voltage V1, and V2 denotes the second voltage V2. Further, Sf represents a feedback signal output when the output unit 101 determines that an overcurrent flows in the electronic circuit module 100.

When the first voltage V1 output from the switching unit 104 does not pass through the convertor 102, the first voltage V1 may increase linearly, as shown in FIG. 7, and thus the overcurrent may not be easily detected. Further, the second voltage V2 output through the convertor 102 may rapidly change within a detection part, and thus the output unit 101 may be configured to more easily output the feedback signal which is an overcurrent detection signal.

In particular, when the second voltage V2 in a region in which a voltage is the reference voltage or greater increases to have a value obtained by combining the first division voltage with the third voltage V3 at the first division voltage, a substantial voltage difference occurs before and after the reference voltage, and thus the overcurrent detection may be performed more easily. The second voltage V2 may be further increased by adjusting a value of the resistor disposed in the output of the comparator 102-1 as described above. When the second voltage V2 increases nonlinearly in a region in which a voltage is the overcurrent reference voltage or greater, the second voltage V2 may increase significantly with respect to a minimal current change. This characteristic may effectively compensate for when a detection time is delayed by the reference voltage of the output unit 101 being increased due to noise. Due to the nonlinear voltage increase characteristic of the second voltage V2, the voltage may be increased significantly within a short time period to reduce the detection delay time.

For example, when values of resistors R1 and R2 are set to 9:11, the first division voltage in the comparator 102-1 may correspond to a half of the first voltage V1, and a half of the reference voltage applied to the comparator 102-1, the second voltage V2 may have a value calculated as follows.

$$V2 = \begin{cases} 0.55V3 + 0.5V1 \text{(when } V1 > Vr) \\ 0.5V1 \text{(when } V2 > Vr) \end{cases} \quad \text{Equation 3}$$

Wherein, the second voltage V2 has a value of 0.55V3+0.5V1 when the first voltage V1 is greater than the reference voltage, and a value of 0.5V1 when the first voltage V1 is less than the reference voltage, the second voltage V2 may have a value ranging from about 0.5V1 to 0.55V3+0.5V1 and may change nonlinearly. Due to the nonlinearly changing voltage, the output unit 101 may more easily output the feedback signal due to the overcurrent.

Figure 8:
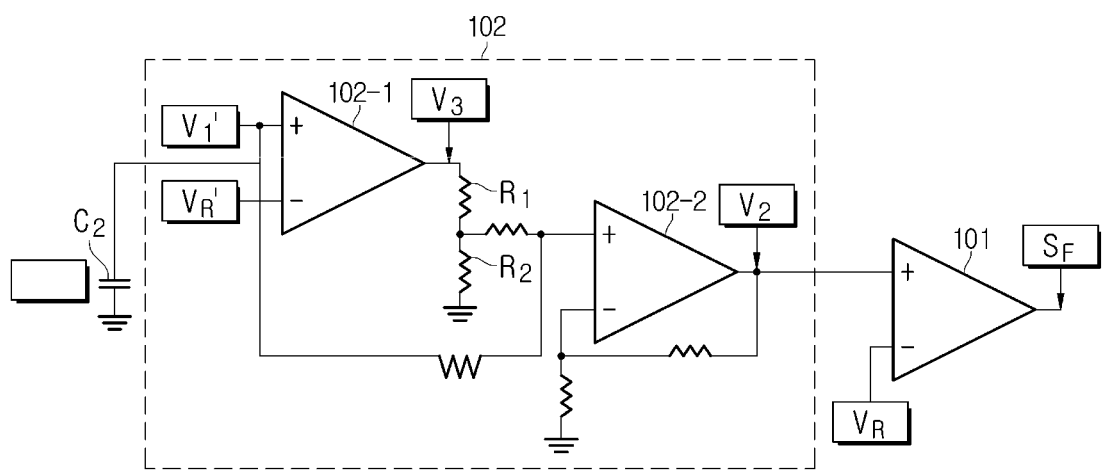
FIG. 8 is an exemplary circuit diagram of a convertor in accordance with an exemplary embodiment of the present disclosure.
Figure 9A:
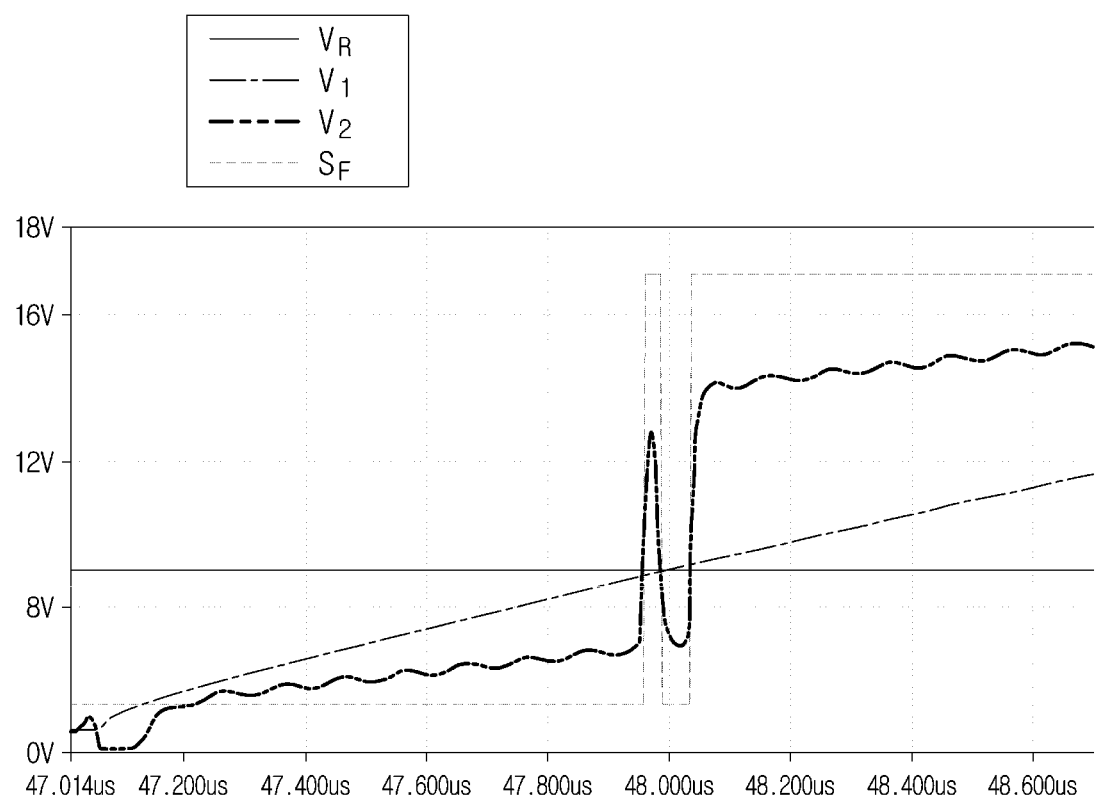
FIGS. 9A and 9B are exemplary graphs of a current flowing in the electronic circuit module and a voltage applied to the electronic circuit module over time in accordance with an exemplary embodiment of the present disclosure.
Figure 9B:
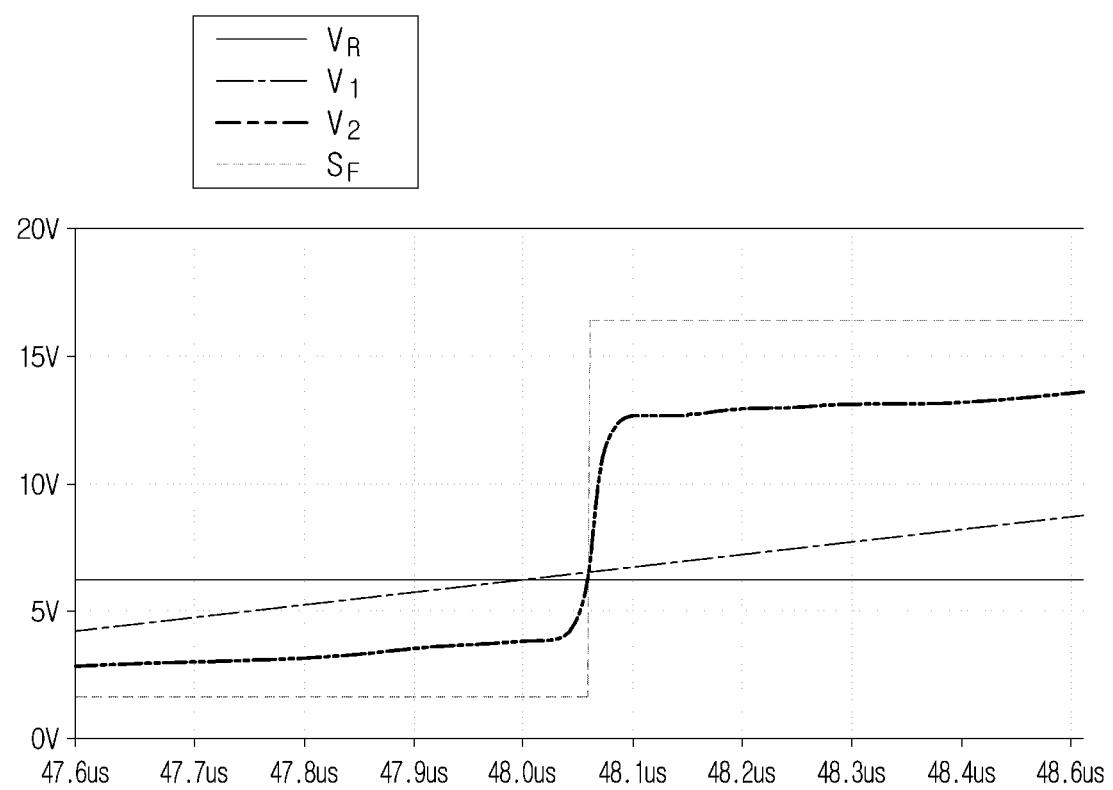

FIG. 8 is an exemplary circuit diagram of a convertor 102 in accordance with an exemplary embodiment. FIGS. 9A and 9B are exemplary graphs of a current flowing in an electronic circuit module 100 and a voltage applied to the electronic circuit module 100 over a time period in accordance with an exemplary embodiment. Referring to FIG. 8, FIG. 8 illustrates an exemplary circuit in which a capacitive element C2 may be added to an input of a comparator 102-1. The capacitive element C2 may be a bypass capacitor. The capacitive element C2 may reduce noise of a second voltage V2.

Referring to FIG. 9A, an X-axis in FIG. 9A represents time, and a Y-axis represents the voltage. Referring to FIG. 9A, a second signal may increase sharply near 48 µs due to the noise. When the second signal sharply increases, the output unit 101 may be configured to output the feedback signal since the voltage is greater than the reference voltage. Therefore, the output unit 101 may be configured to output the feedback signal near 48 µs. When the output unit 101 is fed back due to the noise, the switching unit 104 may be turned off, which may cause a malfunction.

FIG. 9B is an exemplary graph showing signals of the circuit diagram of FIG. 8. In other words, the signals of the circuit diagram in which the capacitive element is added to the comparator 102-1 are shown. Comparing FIG. 9A to FIG. 9B, the second voltage V2 may oscillate and the noise occurs in FIG. 9A which shows the capacitive element C2 disconnected from the comparator 102-1. The second voltage V2 may not oscillate and noise may not be generated in FIG. 9B. In other words, the capacitive element C2 may be connected to the comparator 102-1 to perform a bypass capacitance function, thereby enabling the electronic circuit module 100 to operate more stably. Although FIGS. 8, 9A, and 9B illustrate an exemplary embodiment for reducing the noise of the electronic circuit module 100, a configuration for reducing the noise of the electronic circuit module 100 is not limited thereto.

As is apparent from the above description, in an electronic circuit module and a vehicle including the same in accordance with the exemplary embodiment of the present disclosure, an electronic circuit module is prevented from being damaged by efficiently detecting a situation in which an overcurrent flows in the electronic circuit module using an SiC MOSFET.

The disclosed exemplary embodiments have been described above with reference to the accompanying drawings. It should be understood by those skilled in the art that the present disclosure may be implemented in other forms than the disclosed exemplary embodiments without departing from the spirit and essential characteristics of the present disclosure. The disclosed exemplary embodiments are provided for illustrative purposes, and are not to be construed as limiting the present disclosure.

What is claimed is:

1. An electronic circuit module, comprising:
   an input unit configured to input a reference voltage;
   a switching unit configured to output a first voltage based on a current flow;
   a converter configured to output a second voltage based on the first voltage and the reference voltage; and
   an output unit configured to compare a magnitude of the reference voltage with a magnitude of the second voltage to output a feedback signal when the second voltage is greater than the reference voltage,
   wherein the convertor includes:
   a comparator configured to compare a magnitude of a first division voltage obtained by dividing the first voltage by a predetermined ratio with a magnitude of a division reference voltage obtained by dividing the reference voltage by a predetermined ratio to output a third voltage; and
   an adder configured to output the voltage based on the third voltage and the first division voltage.

2. The electronic circuit module of claim 1, wherein the convertor is configured to output the second voltage whose ratio of a variation to a variation of the current is greater than a ratio of a variation of the first voltage to the variation of the current when the current is greater than a predetermined value.

3. The electronic circuit module of claim 1, wherein the comparator includes a resistor and is configured to adjust a magnitude of the third voltage using the resistor.

4. The electronic circuit module of claim 1, further comprising: a controller configured to receive the first voltage from the switching unit to adjust a time required for the second voltage to reach the reference voltage.

5. The electronic circuit module of claim 4, wherein the input unit is configured to input a source current to the controller, and the controller includes a capacitive element and is configured to receive the source current to adjust the time required for the second voltage to reach the reference voltage based on the source current and capacitance of the capacitive element.

6. The electronic circuit module of claim 1, wherein the switching unit includes a MOSFET configured to operate based on a magnitude of the flowing current and a diode connected to the MOSFET, wherein the switching unit is configured to output the first voltage by combining a voltage at both ends of the MOSFET with a voltage at both ends of the at least one diode.

7. The electronic circuit module of claim 1, wherein the convertor includes a capacitive element configured to reduce noise of the second voltage.

8. An electronic circuit system, comprising:
   an input unit configured to input a reference voltage;
   a switching unit configured to output a first voltage based on a current;
   a converter configured to output a second voltage based on the first voltage and the reference voltage; and
   an output unit configured to compare a magnitude of the reference voltage with a magnitude of the second voltage to output a feedback signal when the second voltage is greater than the reference voltage, wherein the convertor includes:
a comparator configured to compare a magnitude of a first division voltage obtained by dividing the first voltage by a predetermined ratio with a magnitude of a division reference voltage obtained by dividing the reference voltage by a predetermined ratio to output a third voltage; and
an adder configured to output the second voltage based on the third voltage and the first division voltage.

9. The electronic circuit system of claim 8, wherein the convertor is configured to output the second voltage whose ratio of a variation to a variation of the current is greater than a ratio of a variation of the first voltage to the variation of the current when the current is greater than a predetermined value.

10. A vehicle, comprising:
an input unit configured to input a reference voltage;
a switching unit configured to output a first voltage based on a current flow;
a converter configured to output a second voltage based on the first voltage and the reference voltage; and
an output unit configured to compare a magnitude of the reference voltage with a magnitude of the second voltage to output a feedback signal when the second voltage is greater than the reference voltage,
wherein the convertor includes:
a comparator configured to compare a magnitude of a first division voltage obtained by dividing the first voltage by a predetermined ratio with a magnitude of a division reference voltage obtained by dividing the reference voltage by a predetermined ratio to output a third voltage; and
an adder configured to output the second voltage based on the third voltage and the first division voltage.

11. The vehicle of claim 10, wherein the convertor is configured to output the second voltage whose ratio of a variation to a variation of the current is greater than a ratio of a variation of the first voltage to the variation of the current when the current is greater than a predetermined value.

12. The vehicle of claim 10, wherein the comparator includes a resistor and is configured to adjust a magnitude of the third voltage by using the resistor.

13. The vehicle of claim 10, further comprising: a controller configured to receive the first voltage from the switching unit to adjust a time required for the second voltage to reach the reference voltage.

14. The vehicle of claim 13, wherein:
the input unit is configured to input a source current to the controller; and
the controller includes a capacitive element and is configured to receive the source current to adjust the time required for the second voltage to reach the reference voltage based on the source current and capacitance of the capacitive element.

15. The vehicle of claim 10, wherein the switching unit includes a MOSFET configured to operate based on a magnitude of the current flow and a diode connected to the MOSFET, wherein the switching unit is configured to output the first voltage by combining a voltage at a first end and a second end of the MOSFET with a voltage at a first end and a second end of the diode to output the first voltage.

16. The vehicle of claim 10, wherein the convertor includes a capacitive element configured to reduce noise of the second voltage.

* * * * *